United States Patent
Kanrei et al.

(10) Patent No.: US 10,446,651 B2
(45) Date of Patent: Oct. 15, 2019

(54) OXIDE SEMICONDUCTOR, SEMICONDUCTOR DEVICE, SEMICONDUCTOR MEMORY DEVICE, AND SOLID-STATE IMAGING DEVICE

(71) Applicant: Kabushiki Kaisha Toshiba, Minato-ku (JP)

(72) Inventors: Nobuki Kanrei, Yokohama (JP); Hisayo Momose, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/697,725

(22) Filed: Sep. 7, 2017

(65) Prior Publication Data
US 2018/0076292 A1 Mar. 15, 2018

(30) Foreign Application Priority Data
Sep. 14, 2016 (JP) .................. 2016-179805

(51) Int. Cl.
*H01L 29/24* (2006.01)
*H01L 27/11573* (2017.01)
*H01L 27/146* (2006.01)
*H01L 29/786* (2006.01)
*H01L 29/66* (2006.01)

(52) U.S. Cl.
CPC ...... *H01L 29/247* (2013.01); *H01L 27/11573* (2013.01); *H01L 27/14616* (2013.01); *H01L 29/66969* (2013.01); *H01L 29/78693* (2013.01)

(58) Field of Classification Search
CPC .................. H01L 29/247; H01L 27/11573
See application file for complete search history.

(56) References Cited

U.S. PATENT DOCUMENTS

| | | | |
|---|---|---|---|
| 5,407,602 A | 4/1995 | Cava | |
| 2012/0032163 A1* | 2/2012 | Yamazaki | H01L 21/02554 257/43 |
| 2016/0343305 A1* | 11/2016 | Kamiyamaguchi | G09G 3/3241 |

FOREIGN PATENT DOCUMENTS

| | | |
|---|---|---|
| JP | 3358893 | 12/2002 |
| JP | 2009-099847 | 5/2009 |
| JP | 2012-049210 | 3/2012 |
| JP | 2012-124446 A | 6/2012 |
| WO | WO 2016/099150 A1 | 6/2016 |

OTHER PUBLICATIONS

My Navi News, "NIMS Develops New Oxide Semiconductor, Key to Next-Generation Display Drive"; Sep. 25, 2013, 3 Pages (with English Translation).

Nobuhiko Mitoma, et al., "Silicon incorporated metal oxide thin film transistors (SiM-OxFT)," 2014, JSAP Autumn Meeting, The Japan Society of Applied Physics, 2 Pages (with English Translation).

* cited by examiner

*Primary Examiner* — Errol V Fernandes
(74) *Attorney, Agent, or Firm* — Oblon, McClelland, Maier & Neustadt, L.L.P.

(57) ABSTRACT

According to one embodiment, an oxide semiconductor includes indium (In), gallium (Ga), and silicon (Si). A composition ratio of Si to In (Si/In) in the oxide semiconductor is larger than 0.2, and a composition ratio of Si to Ga (Si/Ga) in the oxide semiconductor is larger than 0.2.

7 Claims, 16 Drawing Sheets

| SAMPLE NO. | CONDITIONS DURING SPUTTERING | HEAT TREATMENT AFTER FILM FORMATION | COMPOSITION (atomic%) | | | | | | COMPOSITIONAL RATIO | | |
|---|---|---|---|---|---|---|---|---|---|---|---|
| | | | In | Ga | Si | O | H | Ar | Si/In | Si/Ga | In/Ga |
| 1 | LOW OXYGEN | NON | 16.3 | 15.8 | 6.7 | 60.1 | 0.8 | 0.3 | 0.411 | 0.424 | 1.032 |
| 2 | | 420°C, 60 MIN, Ar | 16.5 | 16.0 | 6.8 | 59.8 | 0.6 | 0.3 | 0.412 | 0.425 | 1.031 |
| 3 | | 420°C, 60 MIN, N$_2$+H$_2$(3%) | 16.4 | 16.0 | 6.6 | 59.8 | 0.9 | 0.3 | 0.402 | 0.413 | 1.025 |
| 4 | EXCESS OXYGEN | NON | 16.0 | 15.5 | 6.8 | 59.0 | 2.3 | 0.4 | 0.425 | 0.439 | 1.032 |
| 5 | | 420°C, 60 MIN, Ar | 16.0 | 15.5 | 6.8 | 59.8 | 1.5 | 0.4 | 0.425 | 0.439 | 1.032 |
| 6 | | 420°C, 60 MIN, N$_2$+H$_2$(3%) | 15.9 | 15.5 | 6.6 | 60.2 | 1.4 | 0.4 | 0.415 | 0.426 | 1.026 |

FIG. 2

| NAME OF CALCULATION MODEL | NUMBER OF ATOMS (atoms) | | | | | COMPOSITIONAL RATIO | | |
|---|---|---|---|---|---|---|---|---|
| | In | Ga | Si | O | TOTAL | Si/In | Si/Ga | In/Ga |
| Model L | 16 | 16 | 4 | 56 | 92 | 0.25 | 0.25 | 1.0 |
| Model R | 14 | 14 | 7 | 56 | 91 | 0.50 | 0.50 | 1.0 |
| Model U | 12 | 12 | 10 | 56 | 90 | 0.83 | 0.83 | 1.0 |

FIG. 5

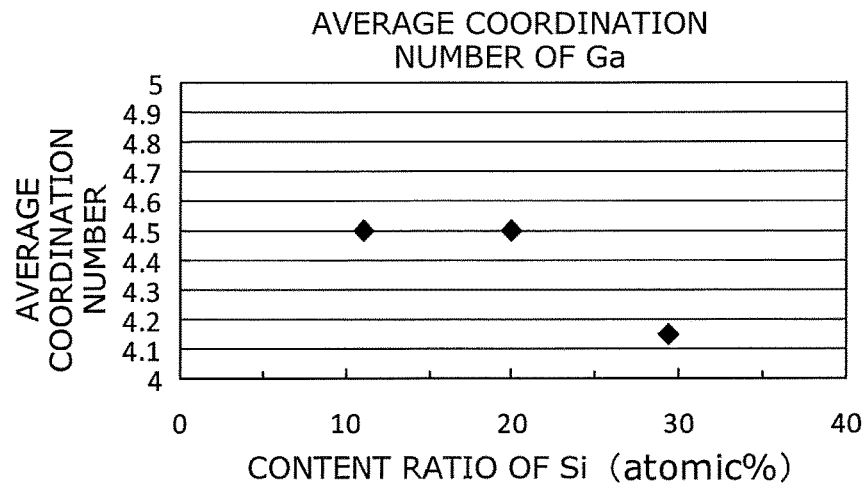
FIG. 7A
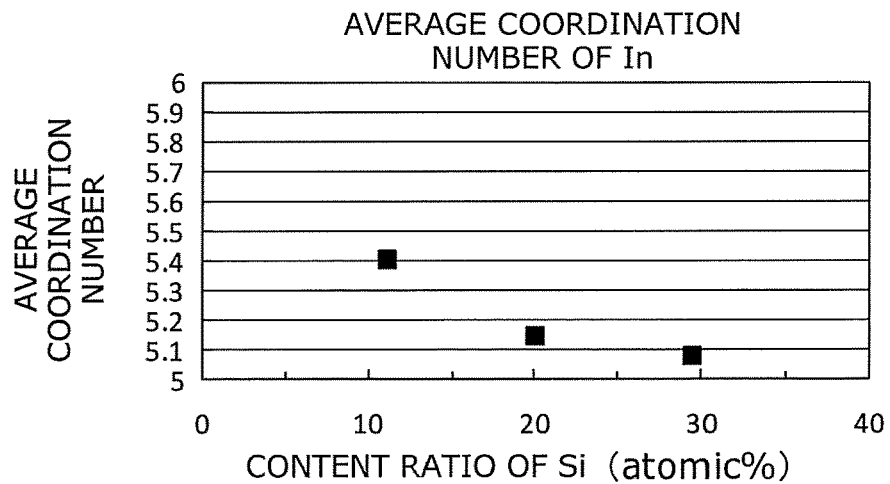
FIG. 7B
| CONTENT RATIO OF Si (atomic%) Si/(In+Ga+Si) | AVERAGE COORDINATION NUMBER OF Ga | AVERAGE COORDINATION NUMBER OF In |
|---|---|---|
| 11.1 | 4.5 | 5.41 |
| 20 | 4.5 | 5.15 |
| 29.4 | 4.15 | 5.08 |
FIG. 7C

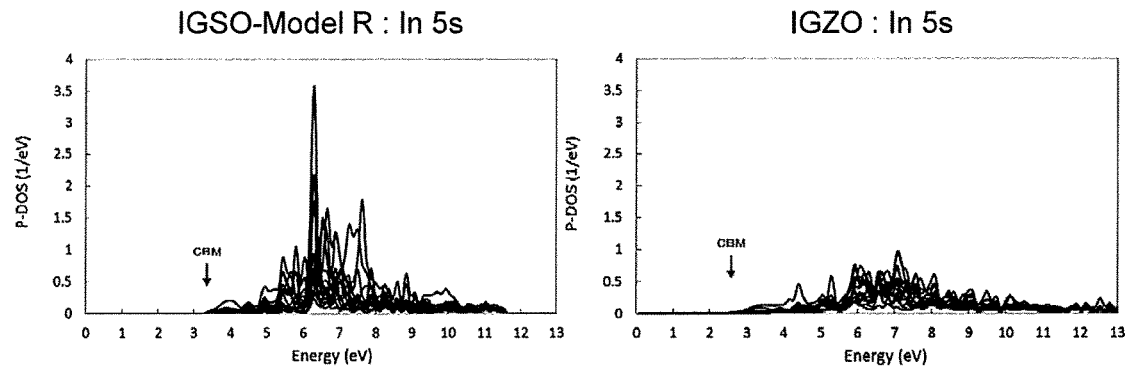
FIG. 13A
FIG. 13C
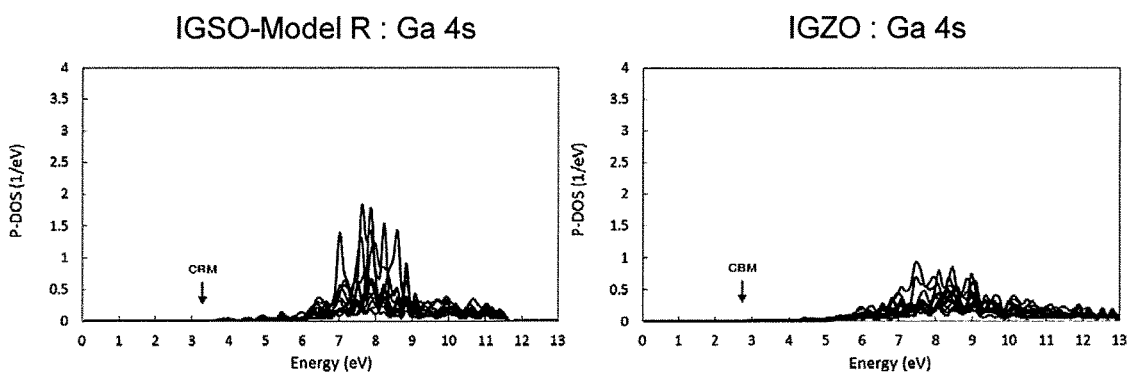
FIG. 13B
FIG. 13D

OXIDE SEMICONDUCTOR, SEMICONDUCTOR DEVICE, SEMICONDUCTOR MEMORY DEVICE, AND SOLID-STATE IMAGING DEVICE

CROSS-REFERENCE TO RELATED APPLICATIONS

This application is based upon and claims the benefit of priority from Japanese Patent Application No. 2016-179805, filed on Sep. 14, 2016; the entire contents of which are incorporated herein by reference.

FIELD

Embodiments described herein relate generally to an oxide semiconductor, a semiconductor device, a semiconductor memory device, and a solid-state imaging device.

BACKGROUND

In a semiconductor device, an oxide semiconductor including a multi-element compound is sometimes used. For example, as an oxide semiconductor having a high carrier conductivity, InGaZnO has been known and applied to a channel layer of a thin film transistor (TFT). The oxide semiconductor has been required to improve, for example, its heat resistance.

BRIEF DESCRIPTION OF THE DRAWINGS

FIG. 2 is a table showing conditions for forming the oxide semiconductor according to the first embodiment and the composition thereof;

FIG. 5 is a table showing a calculation model used in a simulation analysis of the oxide semiconductor according to the first embodiment;

FIG. 7A to FIG. 7C are views showing simulation results for the local structure of the oxide semiconductor according to the first embodiment;

FIG. 13A to FIG. 13D are graphs showing simulation results of the oxide semiconductor according to the first embodiment and an oxide of a reference example;

DETAILED DESCRIPTION

Figure 1:
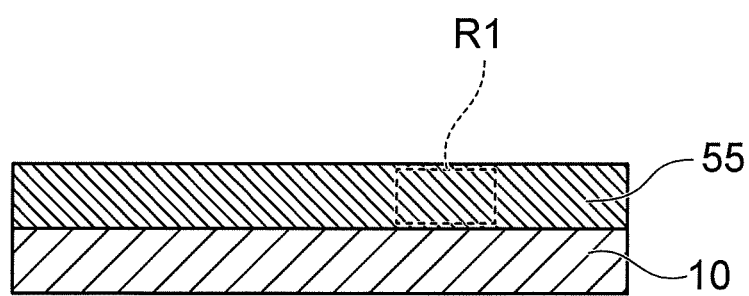
FIG. 1 is a schematic sectional view illustrating an oxide semiconductor according to a first embodiment.

According to one embodiment, an oxide semiconductor includes indium (In), gallium (Ga), and silicon (Si). A composition ratio of Si to In (Si/In) in the oxide semiconductor is larger than 0.2, and a composition ratio of Si to Ga (Si/Ga) in the oxide semiconductor is larger than 0.2.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic sectional view illustrating an oxide semiconductor according to a first embodiment.

In an example shown in FIG. 1, an oxide semiconductor 55 according to the embodiment is provided on a substrate 10. The substrate 10 is, for example, a silicon substrate, a glass substrate, or a plastic substrate. As the substrate 10, a substrate including a resin such as polyimide may be used. The substrate 10 may be impermeable to light. The oxide semiconductor 55 includes indium (In), gallium (Ga), silicon (Si), and oxygen (O). The oxide semiconductor 55 is, for example, a ternary oxide in an amorphous (non-crystalline) state, and an InGaSi-based oxide including In, Ga, Si, and O as main constituent elements.

When a ratio of a composition of Si in the oxide semiconductor 55 to a composition of In in the oxide semiconductor 55 is represented by Si/In, Si/In>0.2 in the oxide semiconductor 55. That is, a ratio of the number of Si atoms included in a region (region R1) in the oxide semiconductor 55 to the number of In atoms included in the region R1 is larger than 0.2.

When a ratio of a composition of Si in the oxide semiconductor 55 to a composition of Ga in the oxide semiconductor 55 is represented by Si/Ga, Si/Ga>0.2 in the oxide semiconductor 55. That is, a ratio of the number of Si atoms included in a region (region R1) in the oxide semiconductor 55 to the number of Ga atoms included in the region R1 is larger than 0.2.

When the content ratio of Si to the sum of a composition of In, a composition of Ga, and a composition of Si in the oxide semiconductor 55 is represented by Si/(In+Ga+Si), Si(In+Ga+Si)>0.09 in the oxide semiconductor 55. The ratio of the number of Si atoms to the sum of the number of In atoms, the number of Ga atoms, and the number of Si atoms is higher than 0.09. That is, in the region R1 of the oxide semiconductor 55, the content ratio of Si to the sum of the number of In atoms, the number of Ga atoms, and the number of Si atoms is larger than 9 atomic %. At this time, for example, the composition of In and the composition of Ga can be made approximately equal. That is, when the composition ratio of In to Ga is represented by In/Ga, in the oxide semiconductor 55, In/Ga can be made approximately 1. For example, In/Ga is not less than 0.8 and not more than 2.0.

In the case where an oxide semiconductor is used as a channel layer of a thin film transistor, the oxide semiconductor is formed using, for example, a sputtering method. When the oxide semiconductor is formed using a sputtering method, for example, a mixed gas of argon (Ar) gas and oxygen ($O_2$) gas is used. For example, there is a reference example in which as the oxide semiconductor, amorphous InGaZnO is formed using a sputtering method. In this reference example, the composition (content ratio) of the main element included in InGaZnO greatly varies depending on the ratio of the flow rate of Ar gas to the flow rate of $O_2$ gas. Further, in amorphous InGaZnO, desorption of oxygen, zinc, or the like may occur in a heat treatment at a relatively low temperature. For this reason, it is difficult to control the chemical bonding state of constituent elements in amorphous InGaZnO. Therefore, in the case where InGaZnO is used as a channel layer of a thin film transistor, a variation or change in threshold voltage is likely to occur, and the electrical properties are not stable in some cases.

On the other hand, the oxide semiconductor 55 according to the embodiment includes In, Ga, and Si. The inventors of the application found that the heat resistance of the oxide semiconductor can be greatly improved by the above-mentioned composition. For example, in the oxide semiconductor 55, a change in electrical properties (for example, electrical resistivity) due to a heat treatment is smaller than in an oxide semiconductor such as InGaZnO. By controlling the composition ratio of In, Ga, and Si to an appropriate value, an oxide semiconductor having a large carrier conductivity is obtained. It becomes easy to control the composition of the oxide semiconductor or the chemical bonding state. In the case where the oxide semiconductor 55 is used in a semiconductor device such as a transistor, the stability of the properties of the semiconductor device can be improved. Hereinafter, studies by the inventors of the application will be described.

FIG. 2 is a table showing conditions for forming the oxide semiconductor according to the first embodiment and the composition thereof.

The oxide semiconductor 55 (samples 1 to 6) shown in FIG. 2 is formed by a DC magnetron sputtering method. The thickness of each of the samples 1 to 6 is about 100 nm. In FIG. 2, conditions during the sputtering, conditions for a heat treatment after film formation by sputtering, compositions (atomic %), and composition ratios are shown. In the sputtering, an InGaSiO target (sintered body) is used. The composition ratio of this target is In:Ga:Si=1:1:0.5. In the sputtering, a mixed gas of Ar and $O_2$ is used, and the pressure is set to not less than 0.32 pascal (Pa) and not more than 0.38 Pa. The output of a DC power supply to be used in the sputtering is set to 300 watts (W), and the substrate is not heated during the sputtering.

In the sample 1 to the sample 3, the flow rate ratio of $O_2$ gas during the sputtering is 3.2%. In the sample 4 to the sample 6, the flow rate ratio of $O_2$ gas during the sputtering is 18.9%. Incidentally, the flow rate ratio of $O_2$ gas is represented by a percentage of the flow rate of $O_2$ gas to the sum of the flow rate of Ar gas and the flow rate of $O_2$ gas ($O_2/Ar+O_2$). That is, each of the sample 1 to the sample 3 is the oxide semiconductor 55 formed under low oxygen conditions during the sputtering. Each of the sample 4 to the sample 6 is the oxide semiconductor 55 formed under excess oxygen conditions during the sputtering. The sample 2 and the sample 5 are subjected to a heating treatment at 420° C. for 60 minutes in an inert gas atmosphere including argon after the sputtering. The sample 3 and the sample 6 are subjected to a heating treatment at 420° C. for 60 minutes in a nitrogen gas atmosphere including hydrogen (3 wt %) having a strong reducing property after the sputtering. The sample 1 and the sample 4 are not subjected to a heating treatment.

In the compositional analysis of the sample 1 to the sample 6, Rutherford backscattering spectrometry and hydrogen forward scattering spectrometry are used. As an analyzer, Pelletron 3SDH manufactured by National Electrostatics Corporation is used. The analytical accuracy (atomic %) of the compositions of this device is ±0.2 for In, ±0.3 for Ga, ±0.3 for Si, ±1 for O, ±0.2 for H, and ±0.13 for Ar.

In the sample 1 which is formed under low oxygen conditions and is not subjected to a heat treatment, the composition of In is 16.3 atomic %, the composition of Ga is 15.8 atomic %, the composition of Si is 6.7 atomic %, and the composition of O is 60.1 atomic %. In the sample 1, the content ratio of Si is about 17.3 atomic % (Si/(In+Ga+Si) is about 0.173), and In/Ga is about 1. In the sample 4 which is formed under excess oxygen conditions and is not subjected to a heat treatment, the composition of In is 16.0 atomic %, the composition of Ga is 15.5 atomic %, the composition of Si is 6.8 atomic %, and the composition of O is 59.0 atomic % In the sample 4, the content ratio of Si is about 17.8 atomic % (Si/(In+Ga+Si) is about 0.178), and In/Ga is about 1.

When comparing the sample 1 with the sample 4, it is found that the composition of each of the elements (In, Ga, Si, and O) other than impurities (H and Ar) does not change much with respect to the flow rate ratio of $O_2$ gas during the sputtering. With respect to the samples 1 to 3 formed under low oxygen conditions, when comparing the sample 1 which is not subjected to a heat treatment, the sample 2 which is subjected to a heat treatment in an inert gas atmosphere including argon, and the sample 3 which is subjected to a heat treatment in a nitrogen gas atmosphere including hydrogen (3 wt %) having a strong reducing property, it is found that the composition of each of the elements (In, Ga, Si, and O) other than impurities (H and Ar) hardly depends on the heat treatment conditions. With respect to the samples formed under excess oxygen conditions, when comparing the sample 4 which is not subjected to a heat treatment, the sample 5 which is subjected to a heat treatment in an inert gas atmosphere including argon, and the sample 6 which is subjected to a heat treatment in a nitrogen gas atmosphere including hydrogen (3 wt %) having a strong reducing property, it is found that the composition of each of the elements (In, Ga, Si, and O) other than impurities (H and Ar) hardly depends on the heat treatment conditions. In all samples, the composition of each of the elements other than impurities in the depth direction is substantially constant.

Figure 3:
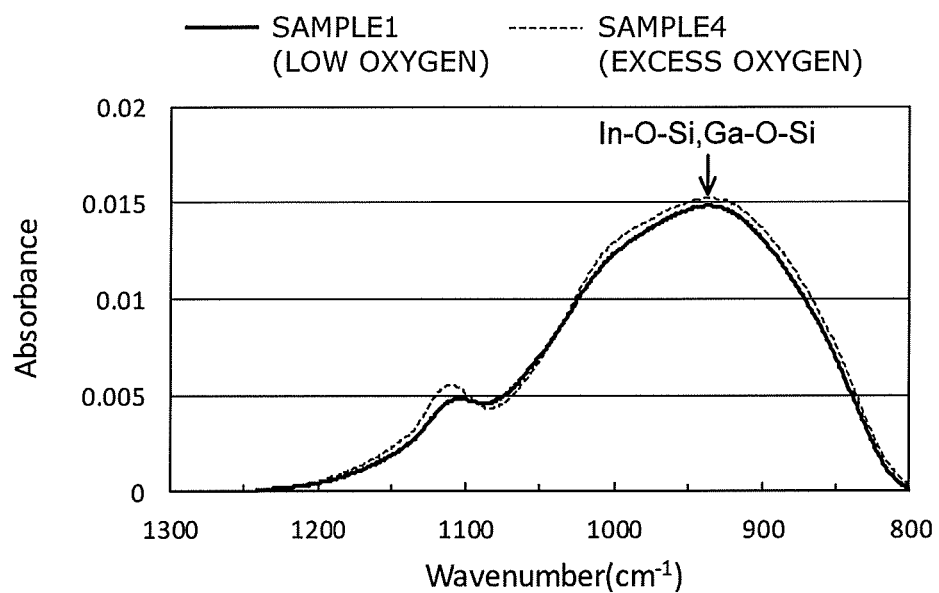
FIG. 3 is a graph illustrating an infrared absorption spectrum of the oxide semiconductor according to the first embodiment.

FIG. 3 is a graph illustrating an infrared absorption spectrum of the oxide semiconductor according to the first embodiment.

In FIG. 3, an infrared absorption spectrum of the sample 1 formed under low oxygen conditions and an infrared absorption spectrum of the sample 4 formed under excess oxygen conditions are shown. Both of the sample 1 and the sample 4 are not subjected to a heat treatment after the sputtering. In the measurement of the infrared absorption spectrum, FT-IR, IFS-66v/S manufactured by Bruker Corporation is used. The vertical axis represents an absorbance (arbitrary unit) of the sample. The horizontal axis represents the wavenumber ($cm^{-1}$) of the infrared radiation.

In each of the sample 1 and the sample 4, an absorption based on Metal-O—Si stretching vibration occurs at a wavenumber of around 930 $cm^{-1}$. Such an absorption peak was found to be a spectrum derived from at least one of an In—O—Si bond and a Ga—O—Si bond. Also in the samples subjected to a heat treatment (sample 2, sample, 3, sample 5, and sample 6), a similar infrared absorption spectrum as that of the sample 1 and the sample 4 is obtained. From these results, it is considered that an In atom and an Si atom are bonded by sharing an O atom. That is, one O atom is bonded to an In atom and also bonded to an Si atom. Similarly, it is considered that a Ga atom and an Si atom are bonded by sharing an O atom. That is, one O atom is bonded to a Ga atom and also bonded to an Si atom. For example, it is presumed that in the oxide semiconductor 55, a structural body in which an In—O cluster and an Si—O cluster are connected, and a structural body in which a Ga—O cluster and an Si—O cluster are connected exist. Incidentally, as a result of analyzing crystallinity using X-ray diffractometry, it was found that the oxide semiconductor 55 (sample 1 to sample 6) is in an amorphous state both before and after the heat treatment.

The bond dissociation energy (kilojoules/mole: kJ/mol) of a diatomic molecule which is regarded as an index of bond strength is as follows: 800 Id/mol for Si—O, 374 Id/mol for Ga—O, 346 kJ/mol for In—O, and 250 kJ/mol for Zn—O. The bond dissociation energy for an Si—O bond is twice or more the bond dissociation energy for the other bonds. As described above, the oxide semiconductor 55 includes at least one of an In—O—Si bond and a Ga—O—Si bond. Due to this, for example, oxygen deficiency hardly occurs in the oxide semiconductor 55, and high heat resistance is obtained.

For example, in the case where amorphous InGaZnO is formed using a sputtering method, the composition of a main constituent element is likely to greatly vary depending on the gas conditions during sputtering. Further, in the heat treatment after sputtering, desorption of oxygen or the like occurs in some cases. On the other hand, in the case of a ternary oxide including In, Ga, and Si, the composition of InGaSiO (the composition ratio of each of In, Ga, Si, and O) does not change much with respect to the flow rate ratio of $O_2$ gas during sputtering, and hardly depends on the heat treatment conditions after sputtering. Further, InGaSiO is hardly crystallized also after the heat treatment and maintains the amorphous state.

Figure 4:
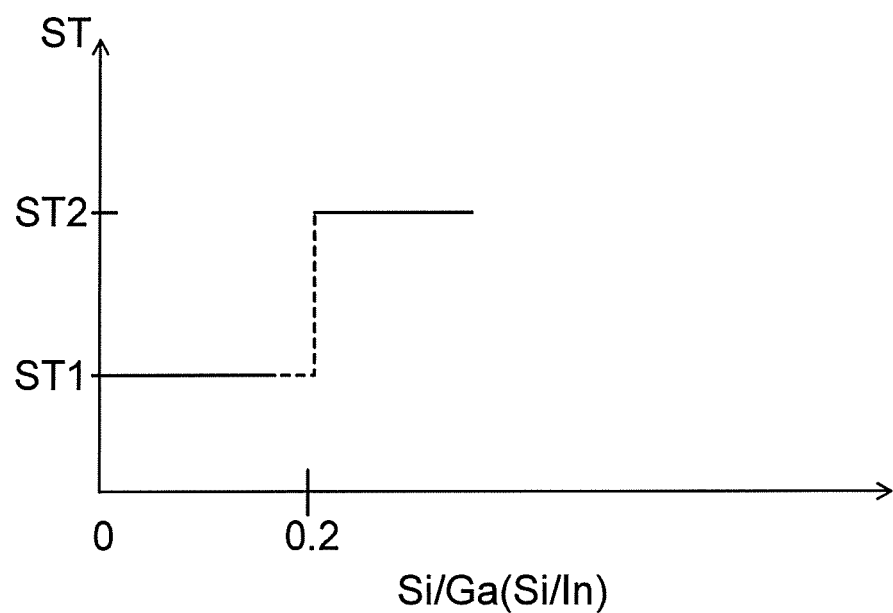
FIG. 4 is a graph illustrating the state of the oxide semiconductor.

FIG. 4 is a graph illustrating the state of the oxide semiconductor.

The vertical axis in FIG. 4 represents a state (ST) of the oxide semiconductor (InGaSiO), and the horizontal axis in FIG. 4 represents Si/Ga (or Si/In). As shown in FIG. 4, InGaSiO can take two states (a state ST1 and a state ST2) depending on Si/Ga. The state ST1 is a state in which the number of Si atoms per five Ga atoms is 1 or less in InGaSiO. The state ST2 is a state in which the number of Si atoms per five Ga atoms is more than 1 in InGaSiO.

In InGaSiO, one Ga atom is bonded to a plurality of oxygen atoms. As described later, the coordination number of a Ga atom in InGaSiO is mainly 4 or 5. Therefore, the state ST2 in which the number of Si atoms per five Ga atoms is more than 1 is, for example, a state in which each of the Ga atoms in InGaSiO is likely to form a Ga—O—Si bond. As described above, the bond dissociation energy for an Si—O bond is high, and therefore, the Ga—O—Si bond is stable to heat. Therefore, it is considered that the heat resistance of InGaSiO can be improved by setting Si/Ga>0.2 as in the state ST2.

Similarly, a state in which the number of Si atoms per five In atoms is more than 1 in InGaSiO is a state in which each of the In atoms in InGaSiO is likely to form an In—O—Si bond. Therefore, it is considered that the heat resistance of InGaSiO can be improved by setting Si/In>0.2. As described above, in the embodiment, In/Ga can be set to about 1. At this time, in the state ST2, Si/(In+Ga+Si)>0.09.

In order to clarify the structure and electronic state of InGaSiO, a local structure analysis and an electronic state analysis were performed for InGaSiO in an amorphous state using a molecular dynamics method and first-principles calculation. By doing this, an effect brought about by Si in a ternary oxide of In, Ga, and Si was studied in detail.

FIG. 5 is a table showing a calculation model used in a simulation analysis of the oxide semiconductor according to the first embodiment.

Three types of calculation models of InGaSiO were used. FIG. 5 shows the number of atoms (atoms) and composition ratio in each calculation model.

In each calculation model, the total number of atoms is 90 to 92 atoms. In InGaSiO, an In—O cluster and a Ga—O cluster are, for example, connected with a given regularity, and each of the In—O cluster and the Ga—O cluster is considered to share part of oxygen atoms with an Si—O cluster. Based on this, In/Ga was set to 1. The number of O (oxygen) atoms was set to a value that satisfies charge neutralization conditions in all models in consideration of the valence of each of In, Ga, and Si. A simulation model of an amorphous structure was fabricated by a melt and quench method in which classical molecular dynamics calculation and first principle molecular dynamics calculation are combined. With respect to each calculation model, a local structure analysis at a temperature of 300 K was performed using a first principle molecular dynamics method. Thereafter, the electronic state was analyzed by first principle calculation to which a hybrid functional was applied.

In a model L, the number of In atoms is 16, the number of Ga atoms is 16, the number of Si atoms is 4, and the number of O (oxygen) atoms is 56. In the model L, the content ratio of Si is 11.1 atomic % (Si/(In+Ga+Si)=0.111). With respect to the composition ratio of Si, each of Si/In and Si/Ga is 0.25. With respect to the composition ratio of In and Ga, In/Ga is 1.

In a model R, the number of In atoms is 14, the number of Ga atoms is 14, the number of Si atoms is 7, and the number of O (oxygen) atoms is 56. In the model R, the content ratio of Si is 20.0 atomic % (Si/(In+Ga+Si)=0.2). With respect to the composition ratio of Si, each of Si/In and Si/Ga is 0.5. With respect to the composition ratio of In and Ga, In/Ga is 1.

In a model U, the number of In atoms is 12, the number of Ga atoms is 12, the number of Si atoms is 10, and the number of O (oxygen) atoms is 56. In the model U, the content ratio of Si is 29.4 atomic % (Si/(In+Ga+Si)=0.294). With respect to the composition ratio of Si, each of Si/In and Si/Ga is 0.833. With respect to the composition ratio of In and Ga, In/Ga is 1.

As described above, in the three types of calculation models shown in FIG. 5, the ratio occupied by Si in the three elements of In, Ga, and Si is mutually different. The content ratio of Si in the model L is lower than the content ratio of Si in the model U. The content ratio of Si in the model R is between them.

FIG. 6A to FIG. 6C and FIG. 7A to FIG. 7C are views showing simulation results for the local structure of the oxide semiconductor according to the first embodiment.

Figure 6A:
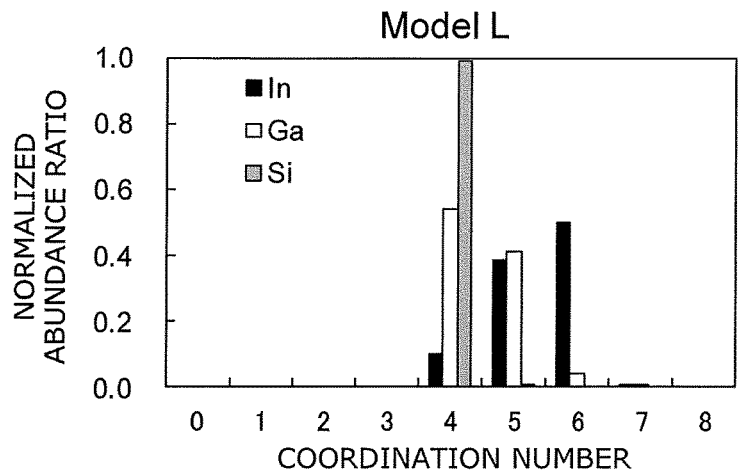
FIG. 6A to FIG. 6C are views showing simulation results for the local structure of the oxide semiconductor according to the first embodiment.
Figure 6B:
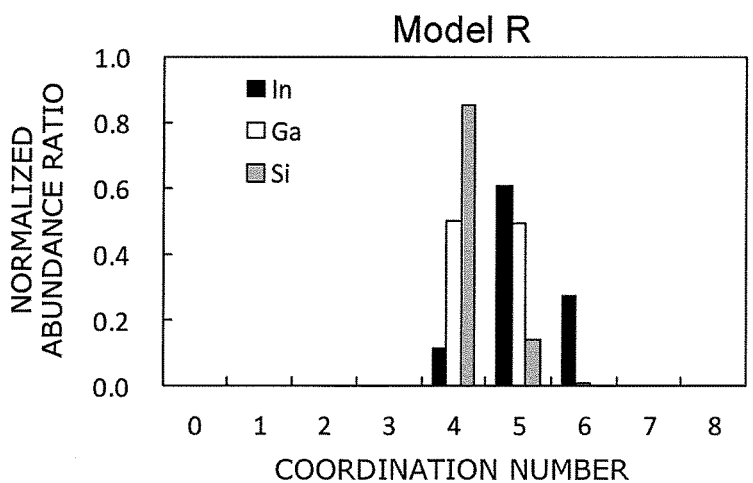
Figure 6C:
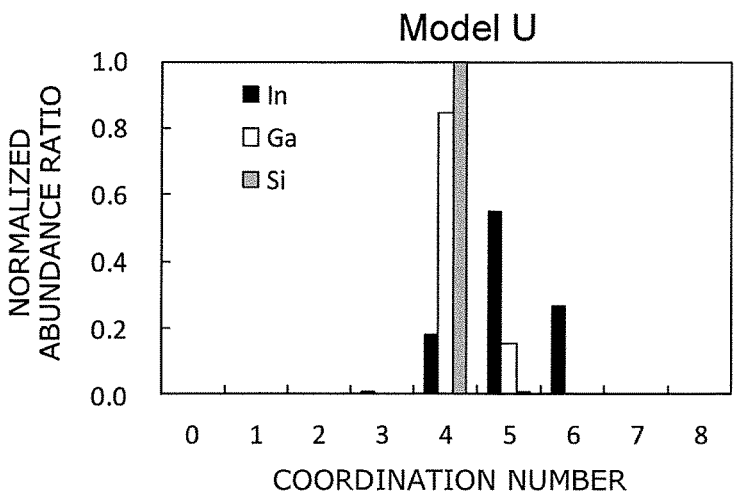

FIG. 6A to FIG. 6C show the distribution of coordination number in a first coordination of each of an In atom, a Ga atom, and an Si atom in InGaSiO having an amorphous structure. FIG. 6A shows the results of the model L, FIG. 6B shows the results of the model R, and FIG. 6C shows the results of the model U.

FIG. 7A is a graph showing the results of FIG. 6A to FIG. 6C as a relationship between the content ratio of Si and the average coordination number of Ga. FIG. 7B is a graph showing the results of FIG. 6A to FIG. 6C as a relationship between the content ratio of Si and the average coordination number of In. FIG. 7C is a table showing numerical values of the plots shown in FIG. 7A and FIG. 7B.

Here, the atom was assumed to be a hard sphere. Based on the radial distribution function (which will be described later with respect to FIGS. 8 and 9), normalization was performed by the number of O atoms present within a range with a radius of 0.26 nanometers (nm) from the atom of interest. By analyzing the coordination number in the first coordination of each of an In atom, a Ga atom, and an Si atom, the coordination structure of an oxide cluster constituting the oxide semiconductor can be identified.

With respect to Si, 4 coordination is dominant in all models, and therefore, Si in InGaSiO is presumed to form an Si—O cluster having a tetrahedral structure regardless of the composition. On the other hand, with respect to In, it was found that the average coordination number decreases with an increase in the content ratio of Si, and a part of typical 6 coordination (octahedron) changes to 5 coordination (pentahedron or hexahedron). On the other hand, with respect to Ga, it was found that in the case where the content ratio of Si is set to 29.4 atomic %, the average coordination number largely decreases and the proportion of a Ga—O cluster composed of 4 coordination (tetrahedron) excessively increases.

From the results of the coordination number analysis, it is interpreted that since the Si—O cluster forms a robust tetrahedral structure regardless of the composition, in the case where the composition of Si is changed in InGaSiO, In and Ga change the coordination structure, thereby achieving structural relaxation. In the model U including much Si, the Ga—O cluster having a low coordination structure is excessively formed, and therefore, it is presumed to be in a geometrically unstable state.

As described previously with respect to FIG. 4, in InGaSiO, by increasing the composition ratio of Si, a Ga—O—Si bond and an In—O—Si bond are likely to be formed, and heat resistance can be improved. On the other hand, for example, as shown in FIG. 7A, when the composition ratio of Si (the content ratio of Si) is set to too high, the Ga—O cluster having a low coordination structure is increased, and therefore, it is considered that the oxide semiconductor becomes unstable. From FIG. 7A, the content ratio of Si is preferably 20 atomic % or less. That is, it is preferred to satisfy Si/(In+Ga+Si)≤0.2. For example, in the region R1 of the oxide semiconductor 55, the content ratio of Si to the sum of the number of In atoms, the number of Ga atoms, and the number of Si atoms is preferably 20 atomic % or less.

At this time, Si/Ga≤0.5. For example, the ratio of the number of Si atoms included in the region R1 to the number of Ga atoms included in the region R1 in the oxide semiconductor 55 is 0.5 or less. Si/In≤0.5. For example, the ratio of the number of Si atoms included in the region R1 to the number of In atoms included in the region R1 in the oxide semiconductor 55 is 0.5 or less.

At this time, In/Ga is 1. The average coordination number of Ga in InGaSiO is 4.5 or more, and the average coordination number of In is 5.15 or more. As described above, it is considered that the Si—O cluster forms a robust tetrahedral structure regardless of the composition. In consideration of the effect of the content ratio of Si on the connected form of an oxide cluster, In/Ga is preferably controlled to be, for example, not less than 0.8 and not more than 2.0. In this case, the average coordination number of Ga in InGaSiO is 4.3 or more and the average coordination number of In is not less than 5.1 and not more than 5.6 or less.

Figure 8A:
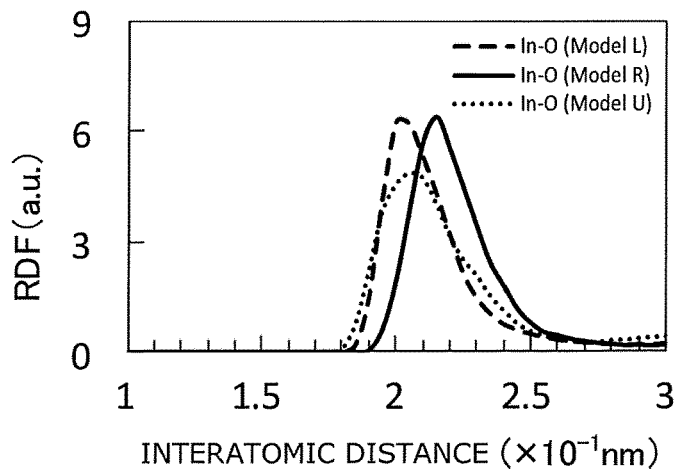
FIG. 8A to FIG. 8C are graphs showing simulation results for the local structure of the oxide semiconductor according to the first embodiment.
Figure 8B:
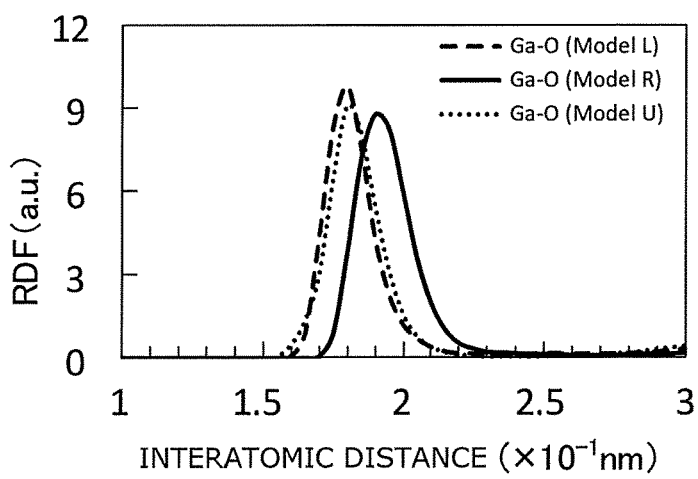
Figure 8C:
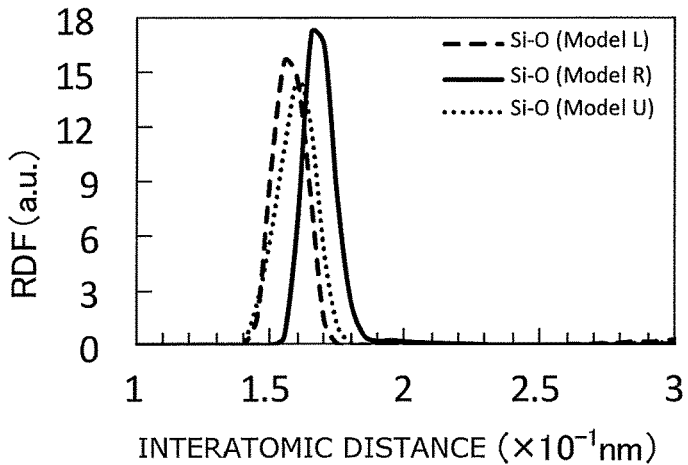

FIG. 8A to FIG. 8C and FIG. 9A and FIG. 9B are graphs showing simulation results for the local structure of the oxide semiconductor according to the first embodiment. These drawings illustrate the radial distribution function for InGaSiO having an amorphous structure. The horizontal axis represents an interatomic distance (unit: nm), and the vertical axis represents an RDF (Radial Distribution Function). The RDF is an abundance ratio normalized by the number of atoms. FIG. 8A shows a distance between an In atom and an O atom. FIG. 8B shows a distance between a Ga atom and an O atom. FIG. 8C shows a distance between an Si atom and an O atom.

As found from FIG. 8A to FIG. 8C, a bond distance of Si—O is the shortest in all models L, R, and U. The variance of interatomic distance between an Si atom and an O atom is extremely narrow as compared with that between an In atom and an O atom and between a Ga atom and an O atom. Such a radial distribution is an appropriate result reflecting the property of Si having a strong bonding strength to oxygen, and contributes to improvement of heat resistance of the oxide semiconductor. In the model R, a bond distance (peak value) between each of an In atom, a Ga atom, and an Si atom and an O atom becomes the longest. However, on the other hand, it was found that the variance of interatomic distance from a nearest neighbor O atom becomes the smallest in the model R.

Figure 9A:
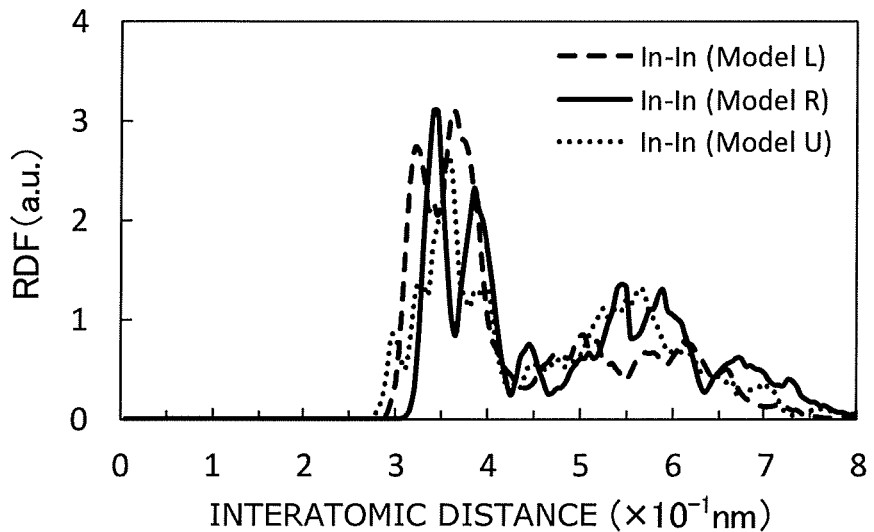
FIG. 9A and FIG. 9B are graphs showing simulation results for the local structure of the oxide semiconductor according to the first embodiment.
Figure 9B:
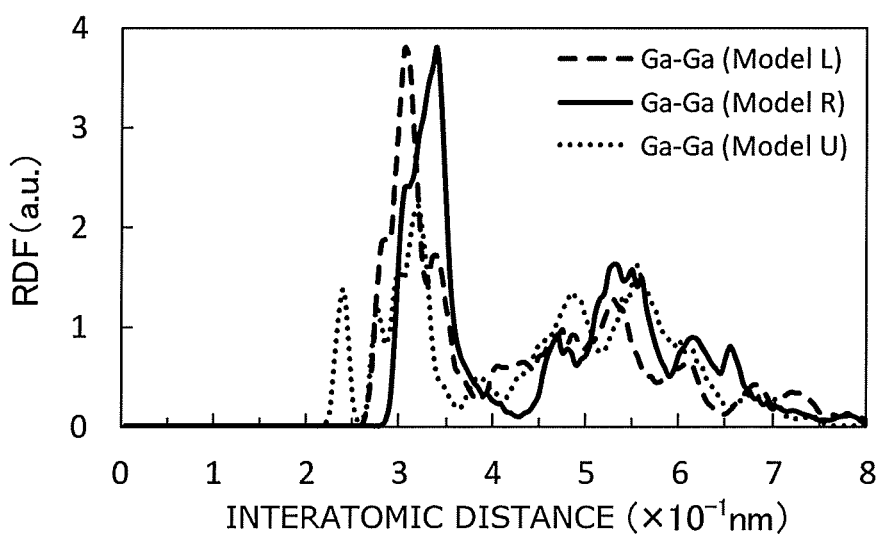

FIG. 9A shows a distance between an In atom and an In atom. FIG. 9B shows a distance between a Ga atom and a Ga atom. As found from FIG. 9A, the variance of interatomic distance between an In atom and an In atom becomes the smallest in the model R, and becomes the largest in the model U. As found from FIG. 9B, the variance of interatomic distance between a Ga atom and a Ga atom becomes the smallest in the model R, and becomes the largest in the model U.

From the simulation results of the radial distribution function described above, it is found that in InGaSiO having an amorphous structure, the local structure geometrically changes depending on the composition, and there exists a proper value in the content ratio of Si. That is, by optimizing the compositions of the three elements of In, Ga, and Si, the local structure of InGaSiO can be controlled. According to the embodiment, in the case where the content ratio of Si is set to approximately 20 atomic % in the three elements of In, Ga, and Si, the variance of interatomic distance is made small, and a structure having excellent short-distance order is obtained. On the other hand, in the case where the content ratio of Si is set to approximately 11 atomic % in the three elements of In, Ga, and Si, a structure having a short interatomic distance is obtained.

Figure 10A:
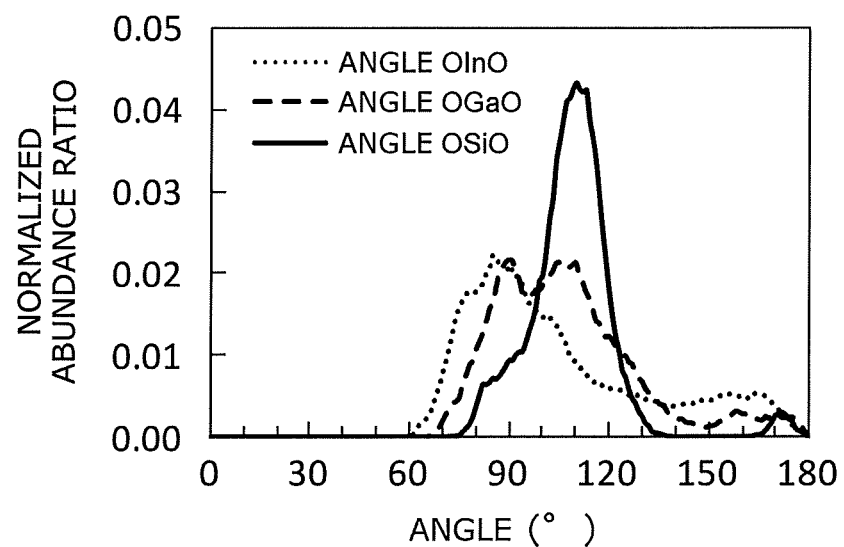
FIG. 10A and FIG. 10B are graphs illustrating simulation results of the oxide semiconductor according to the first embodiment.
Figure 10B:
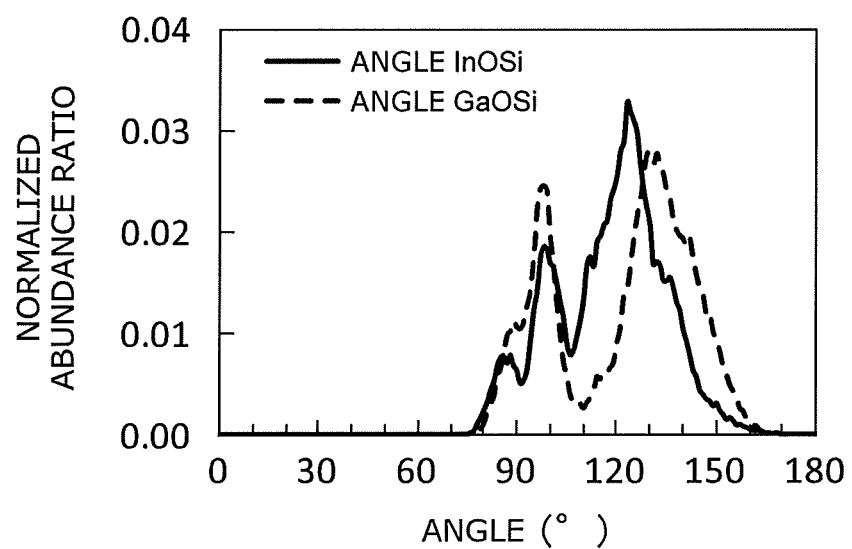

FIG. 10A and FIG. 10B are graphs illustrating simulation results of the oxide semiconductor according to the first embodiment.

FIG. 10A shows a distribution of an angle (angle OInO) formed by an In atom and O atoms, a distribution of an angle (angle OGaO) formed by a Ga atom and O atoms, and a distribution of an angle (angle OSiO) formed by an Si atom and O atoms in the model R having an amorphous structure in which the content ratio of Si is set to 20 atomic %. Incidentally, an angle ABC refers to an angle between a segment connecting A to B and a segment connecting B to C. The vertical axis in FIG. 10A represents an abundance ratio normalized by the number of O atoms present within a range (within a nearest neighbor) with a radius of 0.26 nm from each atom with respect to each of an In atom, a Ga atom, and an Si atom.

As found from FIG. 10A, a steep peak is observed at 110° in the angle OSiO. It was found that the angle OSiO coincides with a typical bond angle (stable angle) in a regular tetrahedral structure. This result is consistent with the result of the coordination number analysis.

FIG. 10B shows a distribution of an angle InOSi (an angle formed by an In atom, an O atom, and an Si atom), and a distribution of an angle GaOSi (an angle formed by a Ga atom, an O atom, and an Si atom) in the model R having an amorphous structure in which the content ratio of Si is set to 20 atomic %. The vertical axis in FIG. 10B represents an abundance ratio normalized within a range with a radius of 0.26 nm centering on the O atom.

Figure 11:
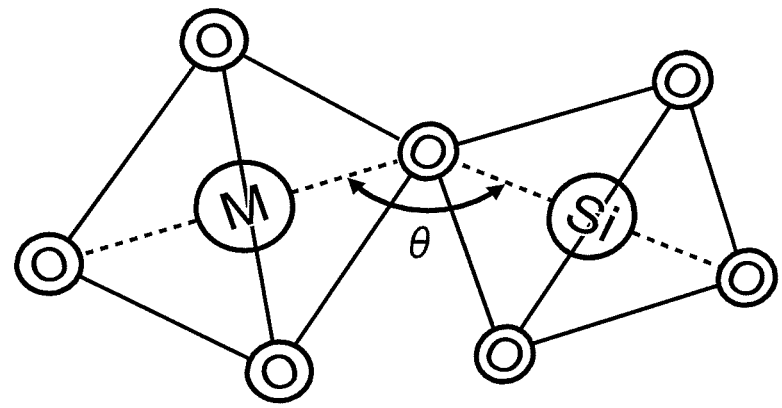
FIG. 11 is a schematic view illustrating the local structure of the oxide semiconductor.

The angle InOSi corresponds to a connection angle of an In—O cluster and an Si—O cluster. The angle GaOSi corresponds to a connection angle of a Ga—O cluster and an Si—O cluster. In each of the distribution of the angle InOSi and the distribution of the angle GaOSi, a significant peak is present, and therefore, in amorphous InGaSiO, as shown in a schematic view of FIG. 11, a structural body in which an In—O cluster and an Si—O cluster are connected by sharing an O atom, and a structural body in which a Ga—O cluster and an Si—O cluster are connected by sharing an O atom are presumed to be present. Incidentally, M shown in FIG. 11 is an In atom or a Ga atom. An angle θ is an angle MOSi. That is, the angle θ is a connection angle of an In—O cluster and an Si—O cluster or a connection angle of a Ga—O cluster and an Si—O cluster. It is considered that in InGaSiO having an amorphous structure, each of an In atom and a Ga atom is bonded to an Si atom by sharing an O atom. This result coincides with the result of the infrared absorption spectrum analysis shown in FIG. 3.

FIG. 12A to FIG. 12F are graphs showing simulation results of an electronic state of the oxide semiconductor according to the first embodiment.

Figure 12A:
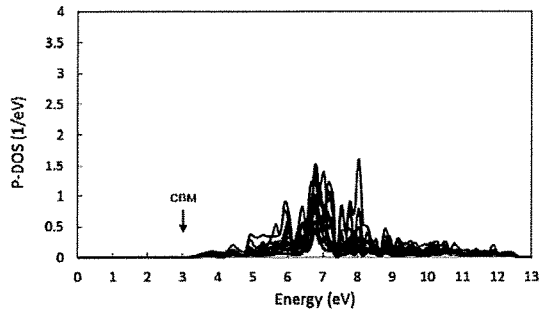
FIG. 12A to FIG. 12F are graphs showing simulation results of an electronic state of the oxide semiconductor according to the first embodiment.
Figure 12D:
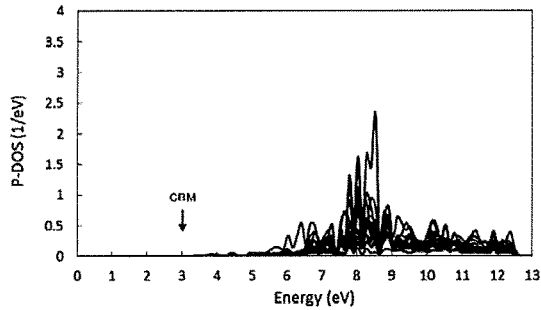
Figure 12B:
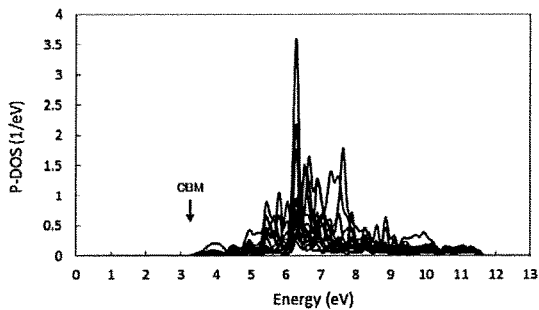
Figure 12E:
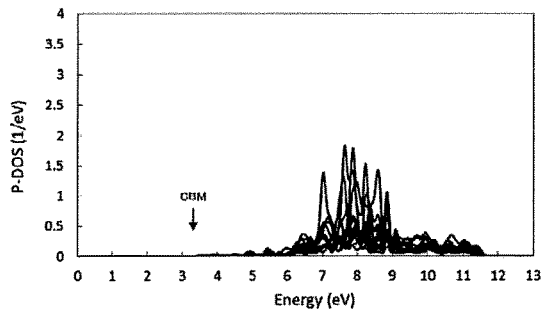
Figure 12C:
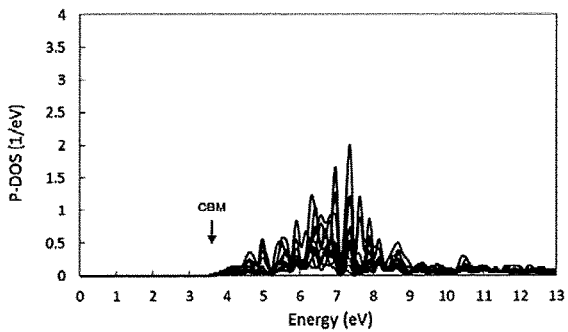
Figure 12F:
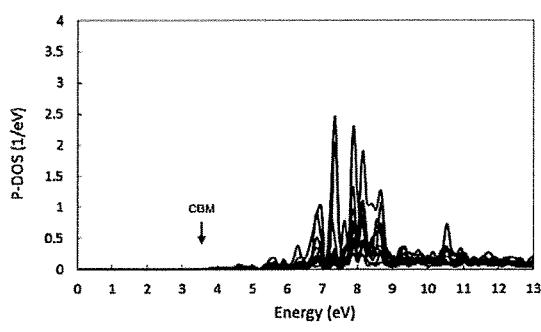

FIG. 12A to FIG. 12C show the density of states (partial density of states: P-DOS (1/eV)) of the 5s orbital of In in the vicinity of the conduction band of amorphous InGaSiO. FIG. 12A, FIG. 12B, and FIG. 12C show the result of the model L, the result of the model R, and the result of the model U, respectively. FIG. 12D to FIG. 12F show the density of states (partial density of states: P-DOS (1/eV)) of the 4s orbital of Ga in the vicinity of the conduction band of amorphous InGaSiO. FIG. 12D, FIG. 12E, and FIG. 12F show the result of the model L, the result of the model R, and the result of the model U, respectively.

The Fermi energy is assumed to be 0 for convenience sake, and the conduction band minimum (CBM) is shown in the drawings. Although not shown in the drawings, the band gap defined by an energy difference between the valence band top and the conduction band minimum of InGaSiO is 3 eV in the model L, 3.2 eV in the model R, and 15 eV in the model U and has a tendency to become larger with an increase in the content ratio of Si.

The conduction band minimum of InGaSiO is occupied mainly by the 5s orbital of In in all models. Since the 4s orbital of Ga is distributed in the energy band higher than the 5s orbital of In, the contribution of the 5s orbital of In to the carrier (electron) conduction is supposed to be larger than the contribution of the 4s orbital of Ga to the carrier (electron) conduction. In an oxide semiconductor, the s orbital of a metal atom with a large principal quantum number greatly contributes to the carrier conduction, and therefore, in particular, the electronic state of the 5s orbital of In becomes an index when the carrier conduction is discussed.

As a result of comparison of the density of states in the 3 types of calculation models, it was found that the density of states of the 5s orbital of In becomes the highest in the model R in which the content ratio of Si is 20 atomic %. Further, it was found that the profile of the density of states of the 5s orbital of In in the model R has a tendency to be distributed on a side of the conduction band minimum as compared with the 5s orbital of In in the model L in which the content ratio of Si is low. In addition, it was found that the profile of the density of states of the 4s orbital of Ga in the model R has a tendency to be distributed on a side of the conduction band minimum as compared with the 4s orbital of Ga in the model L in which the content ratio of Si is low.

The density of states of an atomic orbital in the conduction band is derived from an interaction between neighboring atoms and the profile of the density of states is associated with the coordination structure of an oxide cluster. Therefore, it is considered that as the short-range order is excellent and the geometric position of atoms is more similar, the density of states of the conduction band becomes higher. Further, it is considered that when clusters having a low coordination structure exist more, the profile of the density of states is distributed more widely on a side of the conduction band minimum.

In the model R in which the content ratio of Si is set to atomic %, the variance of interatomic distance is the smallest and the short-range order is excellent. Further in the model R, many In—O clusters in 5-coordination and many Ga—O clusters in 5-coordination exist. For this reason, in the model R, it is presumed that the density of states of the 5s orbital of In becomes high and the profile of the density of states of the 5s orbital of In is distributed on a side of the conduction band minimum.

On the other hand, although not shown in the drawings, in the model U in which the content ratio of Si is set to 29.4 atomic %, it was found that the gap state derived from the 2p orbital of O occurs in the vicinity of the valence band top in spite of a low density. When considering the analysis results of the coordination number, bond angle, connection angle, and the like of InGaSiO, it is considered that the geometric balance of the coordination structure was disrupted because Si was added excessively and distortion occurred in the local structure.

FIG. 13A to FIG. 13D are graphs showing simulation results of the oxide semiconductor according to the first embodiment and an oxide of a reference example.

FIG. 13A and FIG. 13B show an electronic state in the vicinity of the conduction band minimum in InGaSiO according to the embodiment, and FIG. 13C and FIG. 13D show an electronic state in the vicinity of the conduction band minimum in InGaZnO according to the reference example. The Fermi energy is assumed to be 0 for convenience sake, and the conduction band minimum (CBM) is shown in the drawings.

Specifically, FIG. 13A and FIG. 13B show the results of the model R of InGaSiO having an amorphous structure, and FIG. 13A shows the density of states of the 5s orbital of In and FIG. 13B shows the density of states of the 4s orbital of Ga. As described previously, in the model R, the number of In atoms is 14, the number of Ga atoms is 14, the number of Si atoms is 7, and the number of O (oxygen) atoms is 56. The content ratio of Si is 20 atomic % (Si/(In+Ga+Si)=0.2). Each of Si/In and Si/Ga is 0.5. In/Ga is 1.

FIG. 13C and FIG. 13D show the results of InGaZnO having an amorphous structure, and FIG. 13C shows the density of states of the 5s orbital of In and FIG. 13D shows the density of states of the 4s orbital of Ga. This InGaZnO is a model simulating an actual sample formed by a DC magnetron sputtering method using an InGaZnO target having a composition of In:Ga:Zn=1:1:1. The number of atoms was determined based on the result of the composition analysis, and the number of In atoms is 15, the number of Ga atoms is 13, the number of Zn atoms is 11, and the number of O (oxygen) atoms is 53. The number of O atoms is set to a value that satisfies charge neutralization conditions.

From FIG. 13A and FIG. 13C, it was found that there is a possibility that the density of states of the 5s orbital of In of InGaSiO may become higher than the density of states of the 5s orbital of In of InGaZnO. From FIG. 13B and FIG. 13D, it was found that there is a possibility that the density of states of the 4s orbital of Ga of InGaSiO may become higher than the density of states of the 4s orbital of Ga of InGaZnO.

Although not shown in the drawings, InGaZnO is a structural body in which an In—O cluster and a Ga/Zn—O cluster are overlapped with a given regularity (an edge-sharing structure or a corner-sharing structure). The coordination structure of the oxide cluster is distributed widely between 4 coordination (tetrahedron) and 6 coordination (octahedron).

On the other hand, InGaSiO is a structural body in which an In—O cluster and a Ga—O cluster are connected with a given regularity. In InGaSiO, each of the In—O cluster and the Ga—O cluster shares part of oxygen atoms with an Si—O cluster. For example, in the model R in which the content ratio of Si is set to 20 atomic %, the variance of interatomic distance is small and the short-range order is excellent. Further, in the model R, a probability that a geometrically similar oxide cluster exists is high.

It is considered that the density of states of the 5s orbital of In and the 4s orbital of Ga mainly forming the conduction band of the oxide semiconductor has a strong correlation with the short-range order in an amorphous local structure. Due to this, it can be interpreted that a difference in the structure of both models is reflected in the electronic state. Therefore, in InGaSiO, by setting the compositions of the three elements of In, Ga, and Si to appropriate values, a more favorable electronic state than that of InGaZnO can be obtained.

In InGaSiO, there is a positive correlation between the content ratio of Si and the resistivity. When the content ratio of Si is increased, the resistivity increases, and when the content ratio of Si is decreased, the resistivity decreases. In the case where the oxide semiconductor according to the embodiment is applied to a channel layer of a thin film transistor, the resistivity of InGaSiO is desirably set within a proper range, and the content ratio of Si is preferably set within a range from 9 atomic % to 22 atomic %. The content ratio of Si is preferably 10 atomic % or more. Incidentally, in the case where the content ratio of Si is less than 9 atomic %, the resistivity of InGaSiO is decreased to less than $1 \times 10^{-4}$ Ωcm, and therefore, such a case is not preferred.

According to the embodiment, in the oxide semiconductor (InGaSiO) including In, Ga, Si, and O, heat resistance can be improved. By controlling the compositions of the three elements of In, Ga, and Si to be appropriate values, an oxide semiconductor whose heat resistance and carrier conductivity are both high can be realized. Further, it becomes easy to control the compositions of the constituent elements or the chemical bonding state, and the stability of the properties can be improved.

Second Embodiment

Figure 14:
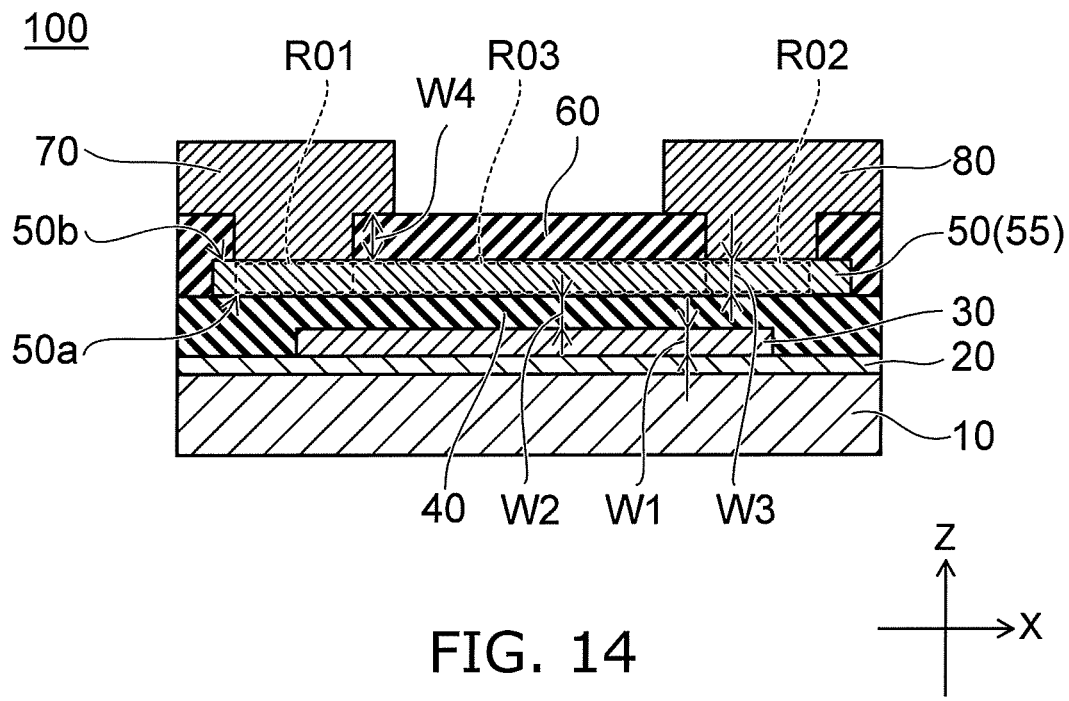
FIG. 14 is a schematic sectional view illustrating a semiconductor device according to a second embodiment.

FIG. 14 is a schematic sectional view illustrating a semiconductor device according to a second embodiment.

As shown in FIG. 14, a semiconductor device 100 according to the embodiment includes a first semiconductor layer 50 (an oxide semiconductor layer), a first conductive portion 70, a second conductive portion 80, and a third conductive portion 30. The semiconductor device 100 may include a substrate 10, a foundation film 20, an insulating film 40, and a protective film 60. The first semiconductor layer 50 includes the oxide semiconductor 55 according to the first embodiment. That is, as a material of the first semiconductor layer 50, the oxide semiconductor 55 is used.

In this example, the semiconductor device 100 is a bottom-gate thin film transistor. For example, the first conductive portion 70 is a source electrode, the second conductive portion 80 is a drain electrode, and the third conductive portion 30 is a gate electrode.

The foundation film 20 is provided on the substrate 10. A direction directed from the substrate 10 to the foundation film 20 is defined as a Z-axis direction (stacking direction). The foundation film 20 includes at least one of silicon oxide ($SiO_x$) and silicon nitride ($SiN_x$). A thickness in the Z-axis direction of the foundation film 20 is approximately 100 nm.

The third conductive portion 30 is provided on the foundation film 20. For example, the third conductive portion 30 includes at least one of tungsten (W), molybdenum (Mo), copper (Cu), tantalum (Ta), and aluminum (Al). The third conductive portion 30 may include at least one of titanium nitride (TiN) and tantalum nitride (TaN). The third conductive portion 30 may include an aluminum alloy. The aluminum alloy includes aluminum as a main component. For example, a hillock is suppressed.

A thickness W1 in the Z-axis direction of the third conductive portion 30 is not less than 10 nm and not more than 200 nm. A side surface of the third conductive portion 30 may be inclined with respect to the Z-axis direction. That is, the side surface of the third conductive portion 30 may have a tapered shape. By forming the side surface of the third conductive portion 30 into a tapered shape, the coverage by the insulating film 40 formed on the third conductive portion 30 is increased. By increasing the coverage, a leakage current can be suppressed.

The insulating film 40 is a gate insulating film. The insulating film 40 is provided between the third conductive portion 30 and the first semiconductor layer 50. The insulating film 40 includes, for example, at least one of silicon oxide ($SiO_x$), aluminum oxide ($Al_xO_y$), silicon nitride ($SiN_x$), and silicon oxynitride ($SiO_xN_y$). The insulating film 40 may include a plurality of films stacked on each other. The plurality of films includes at least one of silicon oxide, aluminum oxide, silicon nitride, and silicon oxynitride. A thickness W2 in the Z-axis direction of the insulating film 40 is not less than 10 nm and not more than 100 nm.

As shown in FIG. 14, the first semiconductor layer 50 includes a first region R01 (source region), a second region R02 (drain region), and a third region R03 (channel region). The third region R03 is provided between the first region R01 and the second region R02. A thickness W3 in the Z-axis direction of the first semiconductor layer 50 is not less than 10 nm and not more than 100 nm. The first semiconductor layer 50 includes a first surface 50a and a second surface 50b. The first surface 50a is a surface on a side of the substrate 10, and the second surface 50b is a surface on an opposite side to the first surface 50a.

A direction directed from the first region R01 to the second region R02 is defined as an X-axis direction (first direction). The Z-axis direction is a direction perpendicular to the X-axis direction. At this time, the third conductive portion 30 is separated from the third region R03 in a direction crossing the X-axis direction (for example, the Z-axis direction). A part of the insulating film 40 is located in the third region R03 and in the third conductive portion 30.

The protective film 60 is provided on the first semiconductor layer 50. The protective film 60 is a film that protects the second surface 50b of the first semiconductor layer 50. For example, the protective film 60 includes at least one of silicon oxide, aluminum oxide, and silicon nitride. The protective film 60 may be a film fabricated using TEOS (Tetra Ethyl Ortho Silicate). The protective film 60 may include a plurality of films stacked on each other. The plurality of films includes, for example, at least one of silicon oxide, aluminum oxide, and silicon nitride. A thickness W4 in the Z-axis direction of the protective film 60 is not less than 10 nm and not more than 200 nm.

The first conductive portion 70 is electrically connected to the first region R01. In this example, the first conductive portion 70 is provided on the first semiconductor layer 50 and the protective film 60. In the first conductive portion 70, a metal film including, for example, at least one of molybdenum, titanium, tantalum, tungsten, and aluminum is used. The first conductive portion 70 may include at least one of molybdenum nitride (MoN), titanium nitride, and tantalum nitride. The first conductive portion 70 may include a plurality of films stacked on each other. The plurality of films includes at least one of the above-mentioned conductive materials. In the first conductive portion 70, a conductive oxide semiconductor thin film including ITO (Indium Tin Oxide) may be used.

The second conductive portion 80 is electrically connected to the second region R02. In this example, the second conductive portion 80 is provided on the first semiconductor layer 50 and the protective film 60. In the second conductive portion 80, the same material as the material of the first conductive portion 70 can be used. On the protective film 60, the first conductive portion 70, and the second conductive portion 80, an overcoat film may be provided. The overcoat film is, for example, a protective film. For example, in the overcoat film, the same material as the protective film 60 can be used.

As described above, in a semiconductor device such as a transistor, the oxide semiconductor 55 according to the embodiment can be used. According to this, the heat resistance and the stability of the properties of the semiconductor device can be improved.

Figure 15:
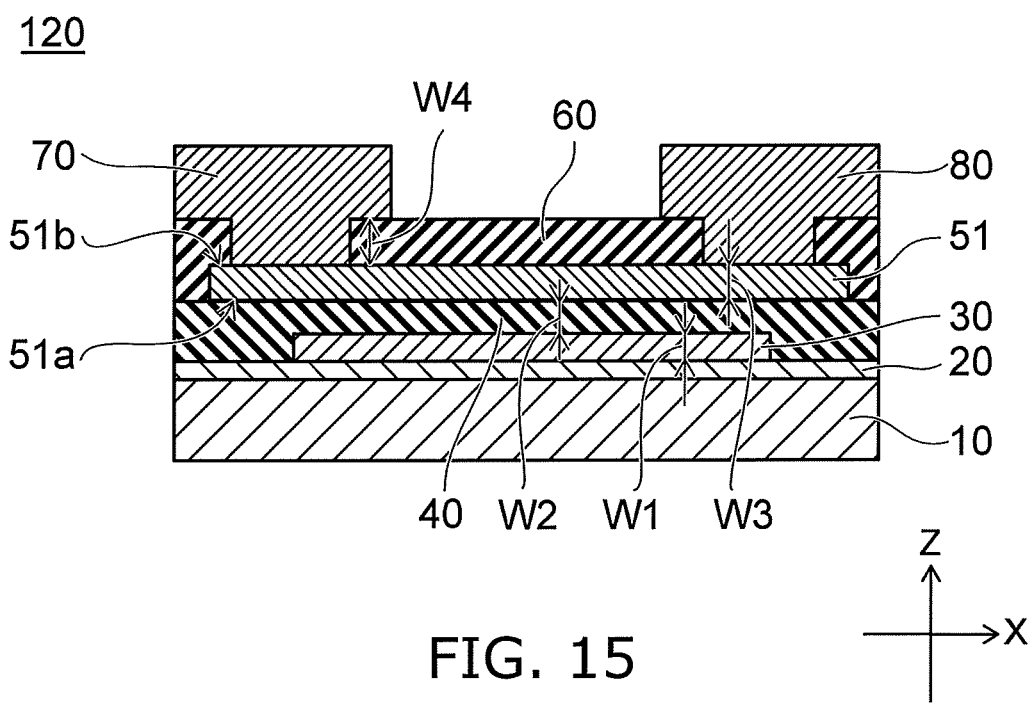
FIG. 15 is a schematic sectional view illustrating another semiconductor device according to the second embodiment.

FIG. 15 is a schematic sectional view illustrating another semiconductor device according to the second embodiment.

A semiconductor device 120 shown in FIG. 15 includes a first semiconductor layer 51 in place of the first semiconductor layer 50 described with respect to FIG. 14. The same description as that for the above-mentioned semiconductor device 100 can be applied to the semiconductor device 120 other than this. The first semiconductor layer 51 includes a plurality of oxide semiconductor layers. The plurality of oxide semiconductor layers is stacked in the Z-axis direction (a direction directed from a lower surface 51a to an upper surface 51b of the first semiconductor layer 51).

Figure 16:
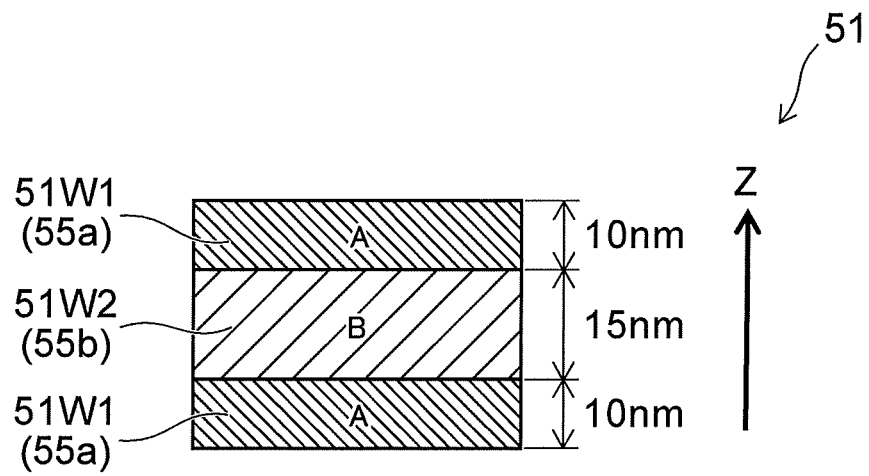
FIG. 16 is a schematic sectional view illustrating the first semiconductor layer of the semiconductor device according to the second embodiment.

FIG. 16 is a schematic sectional view illustrating the first semiconductor layer of the semiconductor device according to the second embodiment.

For example, the first semiconductor layer 51 includes a first layer 51W1 and a second layer 51W2. The second layer 51W2 is stacked with the first layer 51W1 in the Z-axis direction. In this example, between two first layers 51W1, one second layer 51W2 is provided.

In other words, as shown in FIG. 16, the first semiconductor layer 51 includes a first layer L1 (the first layer 51W1), a second layer L2 (the second layer 51W2), and a third layer L3 (the first layer 51W1). The first layer L1 is provided between the third conductive portion 30 and the second layer L2. The first layer L1 is in contact with, for example, the insulating film 40 (a first insulating film). The second layer L2 is provided between the first layer L1 and the third layer L3. The third layer L3 is provided between the protective film 60 (a second insulating film) and the second layer L2. The third layer L3 is in contact with, for example, the protective film 60.

A thickness in the Z-axis direction of the first layer 51W1 is, for example, approximately 10 nm, and a thickness in the Z-axis direction of the second layer 51W2 is, for example, approximately 15 nm. For example, the thickness of the second layer 51W2 is thicker than the thickness of the first layer 51W1.

The first layer 51W1 includes an oxide semiconductor 55a, and the second layer 51W2 includes an oxide semiconductor 55b. To each of the oxide semiconductor 55a and the oxide semiconductor 55b, the same description as that for the oxide semiconductor 55 according to the first embodiment can be applied. That is, each of the oxide semiconductor 55a and the oxide semiconductor 55b is an oxide including In, Ga, and Si, and is, for example, a ternary oxide in an amorphous (non-crystalline) state. In each of the oxide semiconductor 55a and the oxide semiconductor 55b, for example, $0.2 < Si/In \leq 0.5$, $0.2 < Si/Ga \leq 0.5$, $0.09 < Si/(In+Ga+Si) \leq 0.2$, and $0.8 \leq In/Ga \leq 2.0$.

For example, the content ratio of Si in the first layer 51W1 (oxide semiconductor 55a) is 20 atomic % ($Si/(In+Ga+Si)=0.20$), Si/In is about 0.5, and Si/Ga is about 0.5. For example, the content ratio of Si in the second layer 51W2 (oxide semiconductor 55b) is 11 atomic ($Si/(In+Ga+Si)=0.11$), Si/In is about 0.25, and Si/Ga is about 0.25.

In this manner, in the first semiconductor layer 51, a plurality of oxide semiconductors in which the content ratio of Si ($Si/(In+Ga+Si)$) is mutually different is stacked. That is, the content ratio (a first value) of Si in the first layer 51W1 (oxide semiconductor 55a) is different from the content ratio (a second value) of Si in the second layer 51W2 (oxide semiconductor 55b). For example, the second value is smaller than the first value.

In the second layer 51W2, the content ratio of Si is low. The resistivity in the second layer 51W2 is lower than the resistivity in the first layer 51W1. Due to this, many of the carriers (electrons) in the first semiconductor layer 51 are likely to flow in the second layer 51W2. Therefore, an effect of an interface state (defect) present at an interface between the insulating film 40 and the protective film 60 can be relatively reduced. According to the embodiment, a variation in the electrical properties of the semiconductor device 120 can be suppressed.

Figure 17:
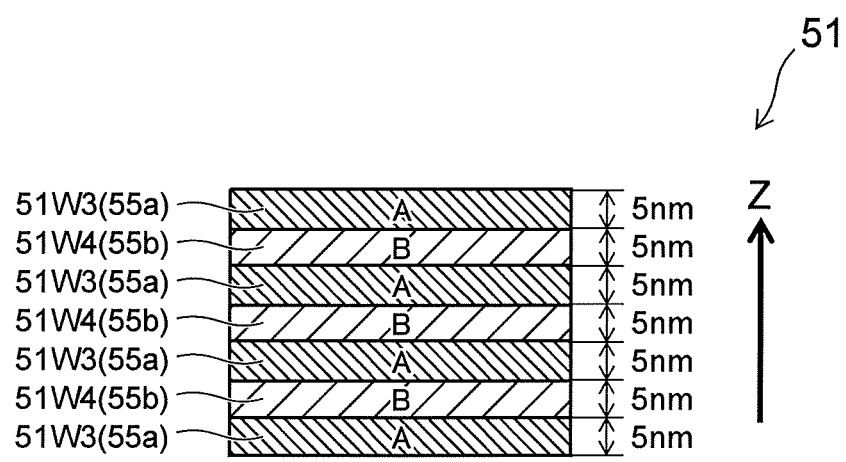
FIG. 17 is a schematic sectional view illustrating another first semiconductor layer of the semiconductor device according to the second embodiment.

FIG. 17 is a schematic sectional view illustrating another first semiconductor layer of the semiconductor device according to the second embodiment.

FIG. 17 shows another example of the first semiconductor layer 51 described with respect to FIG. 15. The first semiconductor layer 51 shown in FIG. 17 includes a first layer 51W3 and a second layer 51W4. In this example, four first layers 51W3 and three second layers 51W4 are alternately stacked in the Z-axis direction. A thickness along the Z-axis direction of each of the first layer 51W3 and the second layer 51W4 is, for example, approximately 5 nm. Incidentally, the thickness of the plurality of layers included in the first semiconductor layer 51 may be mutually different, and can be appropriately set as long as the total thickness is, for example, 100 nm or less. The number of layers included in the first semiconductor layer 51 is also arbitrary as long as the thickness of the first semiconductor layer 51 is 100 nm or less.

For example, the first layer 51W3 and the second layer 51W4 include the oxide semiconductor 55a and the oxide semiconductor 55b described above, respectively. That is, the content ratio of Si in the first layer 51W3 is 20 atomic %, and the content ratio of Si in the second layer 51W4 is 11 atomic %.

In the first layer 51W3 and the second layer 51W4, the content ratio of Si is different. Therefore, in the first layer 51W3 and the second layer 51W4, the structure of the oxide cluster or the band gap is different. In the case where the first layer 51W3 and the second layer 51W4 are periodically stacked in the Z-axis direction, an interaction of each oxide semiconductor layer becomes strong. Therefore, also in the case where the first semiconductor layer 51 shown in FIG. 17 is used, the heat resistance and the stability of the properties of the semiconductor device can be improved. For example, the heat resistance, carrier conductivity, and resistivity (carrier concentration) can be simultaneously controlled, and a semiconductor device having more stabilized properties and high reliability is provided.

Third Embodiment

Figure 18:
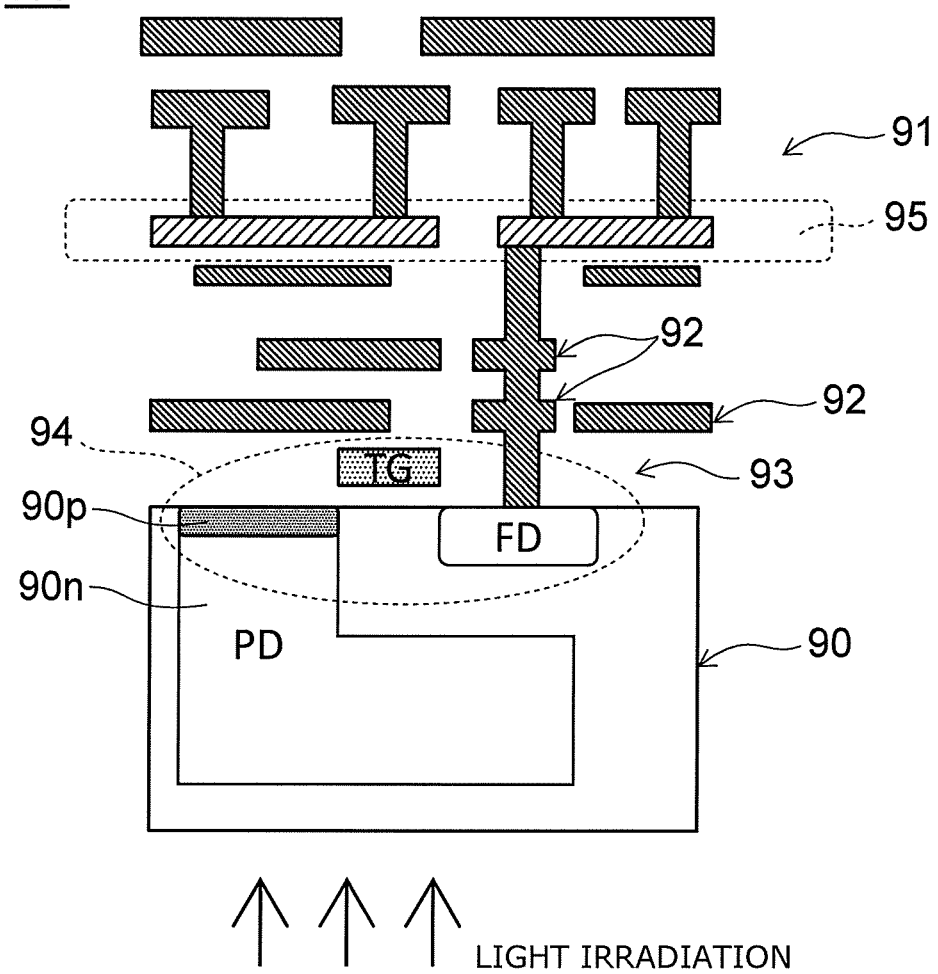
FIG. 18 is a schematic sectional view illustrating a solid-state imaging device according to a third embodiment.

FIG. 18 is a schematic sectional view illustrating a solid-state imaging device according to a third embodiment.

As shown in FIG. 18, in a solid-state imaging device 150 according to the embodiment, a light receiving portion 90 and an interconnect portion 91 are provided. The solid-state imaging device 150 is, for example, a back-illuminated CMOS (Complementary Metal-Oxide Semiconductor) image sensor. In the back-illuminated CMOS image sensor, light is incident from an opposite side of a surface on which the interconnect portion 91 is provided. On the light receiving portion 90, a color filter or a light gathering element such as a microlens can be provided.

The light receiving portion 90 is, for example, an epitaxial layer formed on a semiconductor substrate such as a silicon substrate. The light receiving portion 90 includes an n-type diffusion layer 90n and a p-type region 90p, and is provided with a photodiode PD. The interconnect portion 91 includes a multi-layer interconnect 92 and an interlayer insulating layer 93. The multi-layer interconnect 92 is formed in the interlayer insulating layer 93.

In the photodiode PD, photoelectric conversion is performed. That is, light irradiated on the light receiving portion 90 is converted into charges and stored. The n-type diffusion layer 90n stores signal electrons generated by photoelectric conversion. A transfer transistor 94 is provided in the vicinity of an interface between the light receiving portion 90 and the interconnect portion 91, and signal electrons stored in the n-type diffusion layer 90n are moved to a floating diffusion layer FD.

A transistor group 95 is formed in the interconnect portion 91. The transistor group 95 includes a plurality of semiconductor devices (transistors). The transistor group 95 includes, for example, a reset transistor, an amplifier transistor, a selection transistor, etc., and amplifies the signal electrons and outputs them to the multi-layer interconnect 92. As at least one of the plurality of semiconductor devices included in the transistor group 95, the semiconductor device 100 or 120 described with respect to the second embodiment can be used. According to this, for example, high integration, high performance, and multifunctionality can be achieved. Also in the solid-state imaging device 150, heat resistance and stability can be improved.

Fourth Embodiment

Figure 19:
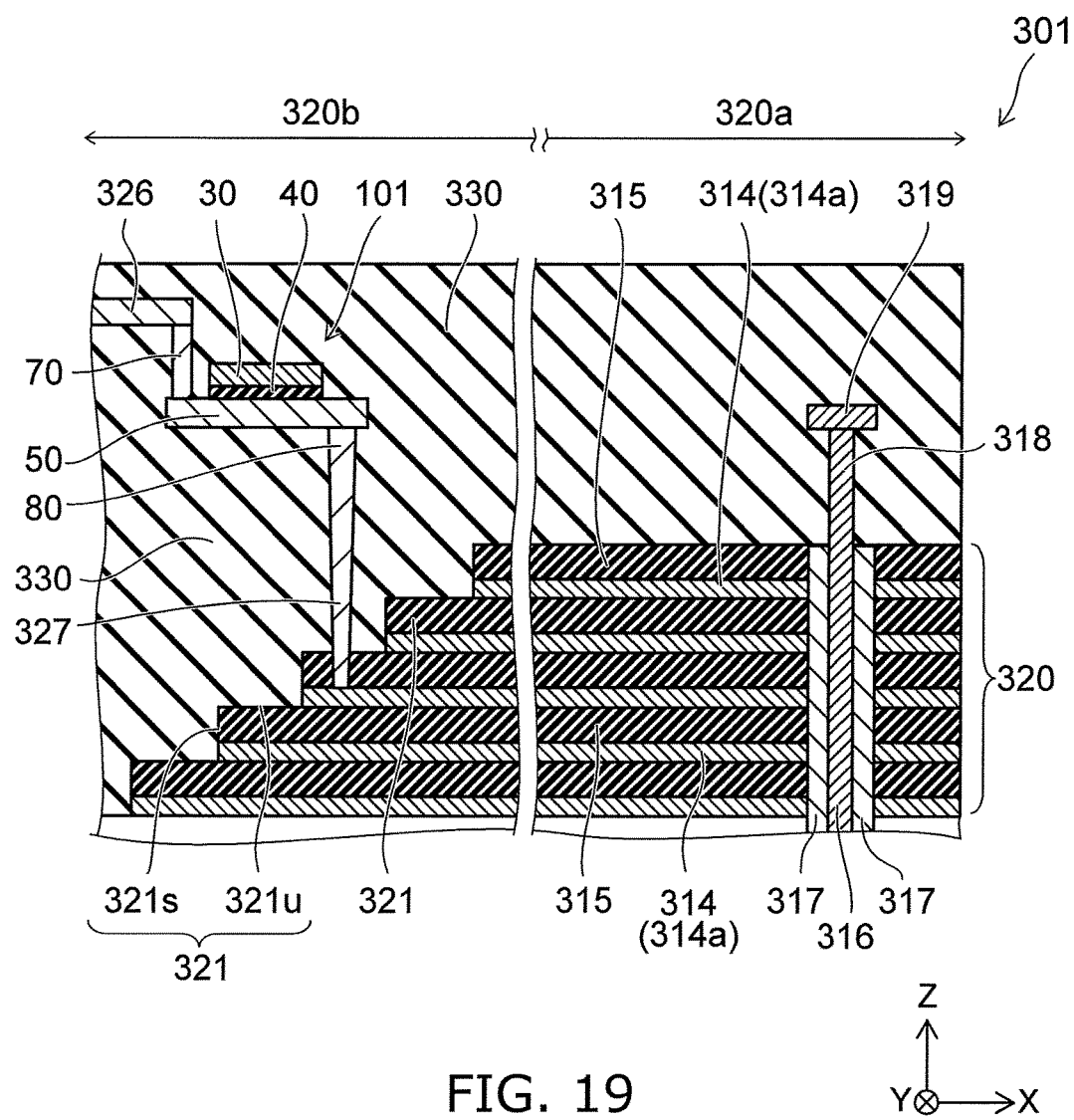
FIG. 19 is a schematic sectional view illustrating a semiconductor memory device according to a fourth embodiment.

FIG. 19 is a schematic sectional view illustrating a semiconductor memory device according to a fourth embodiment.

FIG. 19 shows a portion of a semiconductor memory device 301 (non-volatile memory) according to the embodiment.

The semiconductor memory device 301 includes a stacked body 320. The stacked body 320 includes a plurality of conductive films 314 and a plurality of insulating films 315. The conductive films 314 and the insulating films 315 are stacked along the Z-axis direction. By one conductive film 314 and one insulating film 315, a unit structural body is formed. The conductive film 314 is formed of, for example, a conductive material such as polysilicon, and the insulating film 315 is formed of, for example, an insulating material such as silicon oxide. Each conductive film 314 is divided into a plurality of word lines 314a extending in the X-axis direction.

In a portion 320a of the stacked body 320, a silicon pillar 316 extending in the Z-axis direction is provided, and the silicon pillar 316 pierces the stacked body 320. Around the silicon pillar 316, a memory portion 317 (memory film) is provided. Therefore, a part of the memory portion 317 is disposed between the silicon pillar 316 and the word line 314a.

The memory film 317 is a film capable of storing charges. For example, in the memory film 317, a tunneling insulating film, a charge storage film, and a block insulating film are stacked in this order from a side of the silicon pillar 316. On a portion 320a of the stacked body 320, a bit line 318 extending in the Y-axis direction is provided. An upper end of the silicon pillar 316 is connected to the bit line 318 through a plug 319. A lower end of the silicon pillar 316 is connected to a substrate (not shown).

A shape of an end portion 320b of the stacked body 320 is a stepped shape in which a terrace 321 is formed for each unit structural body composed of one conductive film 314 and one insulating film 315.

Incidentally, the terrace 321 is a part of an end portion in the X-axis direction of the unit structural body. The terrace 321 includes a side surface 321s of the unit structural body covered with an insulating layer 330 and a part of an upper surface 321u of the unit structural body covered with the insulating layer 330. Incidentally, the side surface is a surface crossing the X-axis direction, and the upper surface is a surface crossing the Z-axis direction. One terrace 321 includes the side surface 321s and the upper surface 321u continuous with the side surface 321s. Then, a plurality of terraces 321 is arranged along the Z-axis direction. That is, the side surface 321s and the upper surface 321u are alternately arranged along the Z-axis direction.

The semiconductor memory device 301 includes a semiconductor device 101 (transistor) provided on the end portion 320b (terrace 321). The semiconductor device 101 includes a first semiconductor layer 50, a first conductive portion 70, a second conductive portion 80, a third conductive portion 30, and an insulating film 40. The first semiconductor layer 50 is the same as the first semiconductor layer 50 described with respect to FIG. 14. In the semiconductor device 101, the above-mentioned first semiconductor layer 51 may be used in place of the first semiconductor layer 50.

The first semiconductor layer 50 of the semiconductor device 100 is separated from the terrace 321 in the Z-axis direction. The insulating layer 330 is provided between the first semiconductor layer 51 and the terrace 321. A contact 327 extending in the Z-axis direction is electrically connected to one conductive film 314 (word line 314a). The contact 327 is electrically connected to the second conductive portion 80 of the semiconductor device 101. The first semiconductor layer 50 is electrically connected to an interconnect 326 through the first conductive portion 70. The interconnect 326 is connected to a peripheral circuit.

In this manner, also in the semiconductor memory device 301, the semiconductor device including the oxide semiconductor according to the embodiment can be used. According to this, for example, high integration can be achieved, and the size of a chip can be reduced. Also in the semiconductor memory device 301, heat resistance and stability can be improved.

In the description of this application, the phrase "provided on" not only includes a case of being provided in direct contact with, but also includes a case of being provided by inserting another layer or film therebetween. In the description of this application, the phrase "electrically connected" not only includes a case of being connected in direct contact with, but also includes a case of being connected through another conductive member or the like.

Incidentally, in the description of this application, the term "perpendicular" not only includes strictly perpendicular, but also includes a variation or the like in, for example, a manufacturing process, and may be substantially perpendicular and substantially parallel.

Hereinabove, embodiments of the invention have been described with reference to specific examples. However, embodiments of the invention are not limited to these specific examples. For example, specific configurations of the respective components such as the first semiconductor layer, and the first to third conductive portions are included in the scope of the invention as long as the invention can be carried out in the same manner by appropriate selection from the range known by those skilled in the art and the same effect can be obtained.

Further, a combination of two or more components of each of the specific examples in the technically possible range is also included in the scope of the invention as long as it includes the spirit of the invention.

In addition, all oxide semiconductors, semiconductor devices, semiconductor memory devices, and solid-state imaging devices that can be carried out by appropriately modifying the design by those skilled in the art based on the oxide semiconductors, semiconductor devices, semiconductor memory devices, and solid-state imaging devices described above as the embodiments of the invention also belong to the scope of the invention as long as they include the spirit of the invention.

In addition, it is understood that those skilled in the art can achieve various variations and modifications in the range of the idea of the invention and that these variations and modifications also belong to the scope of the invention.

While several embodiments of the invention have been described, these embodiments are presented only as an example and are not intended to limit the scope of the invention. The novel embodiments can be embodied in various other forms, and various omissions, substitutions, and changes can be made without departing from the spirit of the invention. The embodiments and modifications thereof are included in the scope and spirit of the invention and also included in the inventions described in the claims and in the scope of their equivalents.

What is claimed is:

1. An oxide semiconductor comprising:
   indium (In),
   gallium (Ga), and
   silicon (Si),
   wherein a composition ratio of Si to In (Si/In) in the oxide semiconductor is greater than 0.2, and a composition ratio of Si to Ga (Si/Ga) in the oxide semiconductor is greater than 0.2, and
   wherein the oxide semiconductor comprises at least one selected from the group consisting of an In—O—Si bond and a Ga—O—Si bond.

2. The semiconductor according to claim 1, wherein a composition ratio of the Si to the In (Si/In) is 0.5 or less, and a composition ratio of the Si to the Ga (Si/Ga) is 0.5 or less.

3. The semiconductor according to claim 1, wherein a composition ratio of the In to the Ga (In/Ga) is from 0.8 to 2.0.

4. The semiconductor according to claim 1, wherein a content ratio of the Si to a sum of a composition of the In, a composition of the Ga, and a composition of the Si (Si/(In+Ga+Si)) is greater than 9 atomic % to 20 atomic %.

5. The semiconductor according to claim 1, wherein an average coordination number in a first coordination of the Ga is at least 4.3, and an average coordination number in a first coordination of the In is from 5.1 to 5.6.

6. The semiconductor according to claim 1, wherein the oxide semiconductor is amorphous.

7. An oxide semiconductor comprising:
   indium (In),
   gallium (Ga), and
   silicon (Si),
   wherein a composition ratio of Si to In (Si/In) in the oxide semiconductor is greater than 0.2, and a composition ratio of Si to Ga (Si/Ga) in the oxide semiconductor is greater than 0.2, wherein an average coordination number in a first coordination of the Ga is at least 4.3, and an average coordination number in a first coordination of the In is from 5.1 to 5.6.

* * * * *